(12) United States Patent
Seneviratne et al.

(10) Patent No.: US 9,451,696 B2
(45) Date of Patent: Sep. 20, 2016

(54) EMBEDDED ARCHITECTURE USING RESIN COATED COPPER

(71) Applicants: Dilan Seneviratne, Chandler, AZ (US); Ching-Ping J. Shen, Gilbert, AZ (US); Liwen Jin, Chandler, AZ (US); Deepak Arora, Chandler, AZ (US); Vinodhkumar Raghunathan, Chandler, AZ (US)

(72) Inventors: Dilan Seneviratne, Chandler, AZ (US); Ching-Ping J. Shen, Gilbert, AZ (US); Liwen Jin, Chandler, AZ (US); Deepak Arora, Chandler, AZ (US); Vinodhkumar Raghunathan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 764 days.

(21) Appl. No.: 13/631,959

(22) Filed: Sep. 29, 2012

(65) Prior Publication Data

US 2014/0090879 A1    Apr. 3, 2014

(51) Int. Cl.
| | |
|---|---|
| *H05K 1/11* | (2006.01) |
| *H05K 3/00* | (2006.01) |
| *H01L 23/538* | (2006.01) |
| *H01L 23/00* | (2006.01) |
| *H05K 1/18* | (2006.01) |
| *H05K 3/46* | (2006.01) |
| *H01L 23/498* | (2006.01) |

(52) U.S. Cl.
CPC ............ *H05K 1/112* (2013.01); *H01L 23/5389* (2013.01); *H01L 24/18* (2013.01); *H05K 3/007* (2013.01); *H01L 23/49822* (2013.01); *H01L 2924/18162* (2013.01); *H05K 1/185* (2013.01); *H05K 3/0097* (2013.01); *H05K 3/4682* (2013.01); *H05K 2201/0355* (2013.01); *H05K 2203/0152* (2013.01); *H05K 2203/0369* (2013.01); *H05K 2203/0384* (2013.01); *H05K 2203/1536* (2013.01); *H05K 2203/308* (2013.01)

(58) Field of Classification Search
CPC ...... H05K 3/007; H05K 1/182; H05K 1/183; H05K 1/185
USPC .................. 174/260; 361/760–762, 764
See application file for complete search history.

(56) References Cited

U.S. PATENT DOCUMENTS

| | | | |
|---|---|---|---|
| 5,689,091 A * | 11/1997 | Hamzehdoost | ... H01L 23/49822 174/255 |
| 7,889,509 B2 * | 2/2011 | Urashima | ................ H01G 2/06 257/723 |
| 7,909,977 B2 | 3/2011 | Jomaa et al. | |
| 8,866,287 B2 | 10/2014 | Teh et al. | |
| 2008/0202801 A1 * | 8/2008 | Tuominen | ........... H01L 21/4846 174/260 |
| 2009/0107708 A1 * | 4/2009 | Takahashi et al. | ........... 174/257 |
| 2011/0156231 A1 | 6/2011 | Guzek | |
| 2011/0291293 A1 * | 12/2011 | Tuominen et al. | ........... 257/774 |

(Continued)

*Primary Examiner* — Timothy Thompson
*Assistant Examiner* — Amol Patel
(74) *Attorney, Agent, or Firm* — Konrad Raynes Davda & Victor LLP; Alan S. Raynes

(57) ABSTRACT

Electronic assemblies and methods for their manufacture are described, including those related to the formation of an assembly including a carrier and a resin coated copper layer positioned on the carrier. The resin coated copper layer includes a first layer comprising a resin and a second layer comprising copper, with the first layer bonded to the second layer. The first layer of the resin coated copper is positioned between the carrier and the second layer of the resin coated copper. An opening is formed in the second layer of the resin coated copper. A die is positioned in the opening. A plurality of dielectric layers and metal pathways are positioned on the second layer and on the die. Other embodiments are described and claimed.

20 Claims, 5 Drawing Sheets

(56) References Cited

U.S. PATENT DOCUMENTS

| | | |
|---|---|---|
| 2013/0270719 A1 | 10/2013 | Malatkar et al. |
| 2014/0084475 A1* | 3/2014 | Chen et al. ................... 257/773 |
| 2014/0091440 A1 | 4/2014 | Nair et al. |
| 2014/0091469 A1 | 4/2014 | Raghunathan et al. |
| 2014/0177193 A1 | 6/2014 | Jin et al. |

\* cited by examiner

EMBEDDED ARCHITECTURE USING RESIN COATED COPPER

RELATED ART

One type of package substrate structure is a bumpless build-up layer (BBUL) structure, which is a packaging technology that does not utilize solder bumps to attach a die to a package substrate. The die is positioned on a surface and layers of dielectric and electrically conducting material (e.g., metal) are built-up around the die. The final package structure may include a coreless architecture. A carrier structure may be utilized to support the structure during BBUL formation. The carrier may be separated after certain processing operations are complete.

BRIEF DESCRIPTION OF THE DRAWINGS

Embodiments are described by way of example, with reference to the accompanying drawings, which are not necessarily drawn to scale.

DETAILED DESCRIPTION

Reference below will be made to the drawings wherein like structures may be provided with like reference designations. In order to show the structures of various embodiments most clearly, the drawings included herein may include diagrammatic representations of electronic devices. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to the formation of embedded die structures and assemblies including embedded die structures formed on a carrier structure.

FIGS. 1(A)-1(G) illustrate operations for forming an assembly including an embedded die formed on a carrier structure, in accordance with certain embodiments. In certain embodiments, two identical embedded die assemblies may be formed in a back to back manner. This assemblies are mated together through the shared carried region positioned therebetween.

Figure 1A:
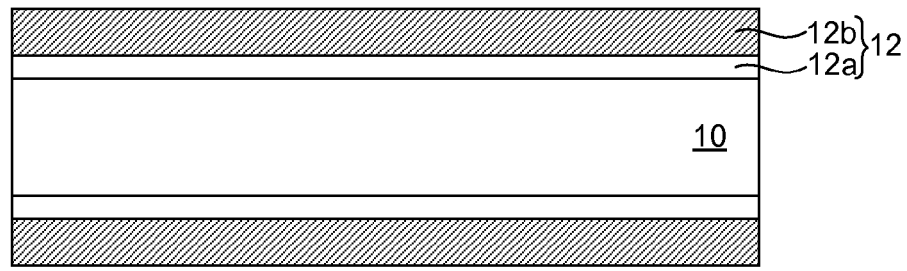
FIGS. 1(A)-1(G) illustrate views of processing operations for forming an assembly, in accordance with certain embodiments.

As illustrated in FIG. 1(A), a carrier structure or region 10 includes a resin coated copper (Cu) layer 12 positioned thereon. The resin coated Cu layer 12 includes a layer 12a comprising resin and a layer 12b comprising Cu, with the resin layer 12a being positioned between the carrier region 10 and the Cu layer 12b. The resin may in certain embodiments comprise an epoxy. The resin may in other embodiments comprise a polyimide. The resin may also comprise a polyimide epoxy copolymer. Other resin materials may also be used. The resin may also include a non-resin filler material positioned therein. The resin layer 12a may be bonded to the Cu layer 12b and then the combined resin coated layer positioned on the carrier region 10. The bonding may be carried out using a suitable lamination process, for example, hot pressing, in which the stack is subjected to elevated temperature and pressure. The resin coated Cu layer 12 may be in the form of a foil.

Figure 1B:
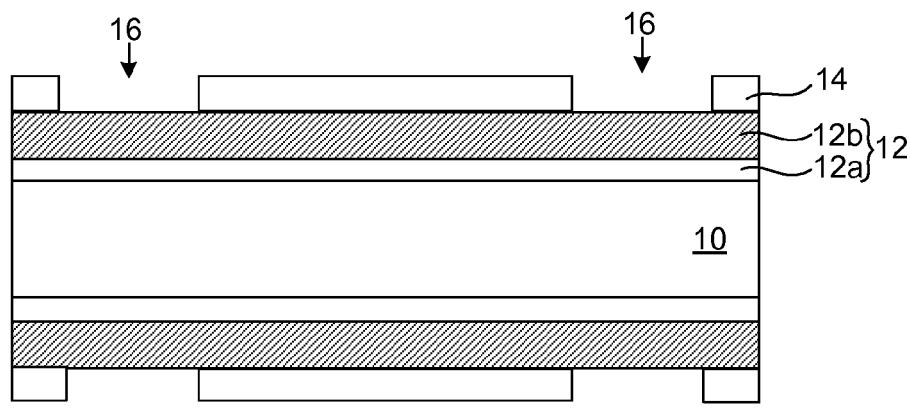
Figure 1C:
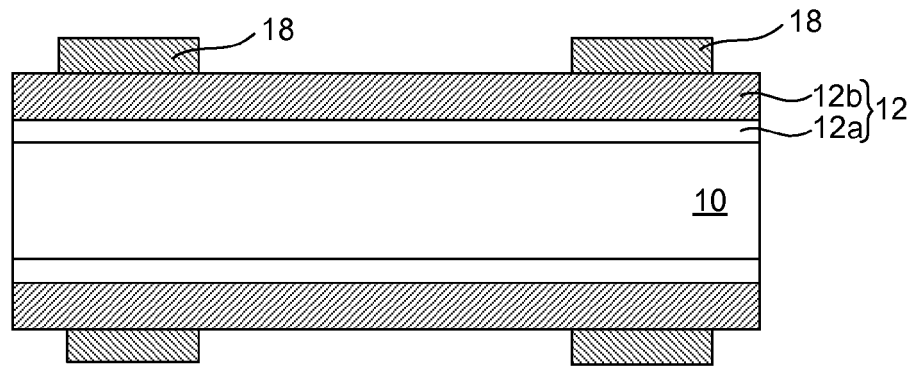

As illustrated in FIG. 1(B), a lithographic patterning operation may be carried out in which a photoresist layer 14 is deposited on the Cu layer 12b and openings 16 formed through which metal pads 18 such as package-on-package (PoP) pads will be formed. The metal pads 18 may be formed using any suitable technique, including, but not limited to, a plating method. The pads 18 may be formed from more than one layer, if desired, for example, a surface finish layer on an underlying metal layer. As used herein, the term metal comprises metals and alloys. After formation of the metal pads 18, the photoresist layer 14 is stripped and the resultant structure appears in in FIG. 1(C), which shows the metal pads 18 formed on the Cu layer 12b.

Figure 1D:
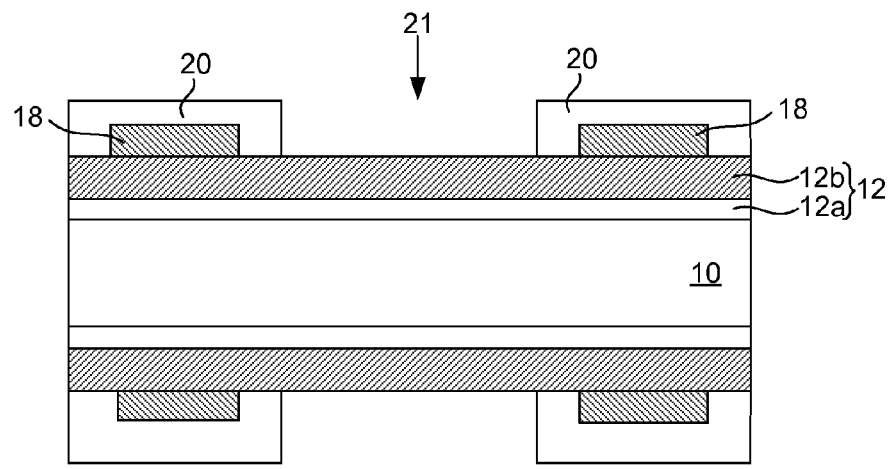

Another lithographic patterning operation may be carried out in which a photoresist layer 20 is deposited on the Cu layer 12b and the pads 18 and a die opening 21 is formed, as illustrated in FIG. 1(D). The resin layer 12a of the resin coated Cu layer may be used as an etch stop.

Figure 1E:
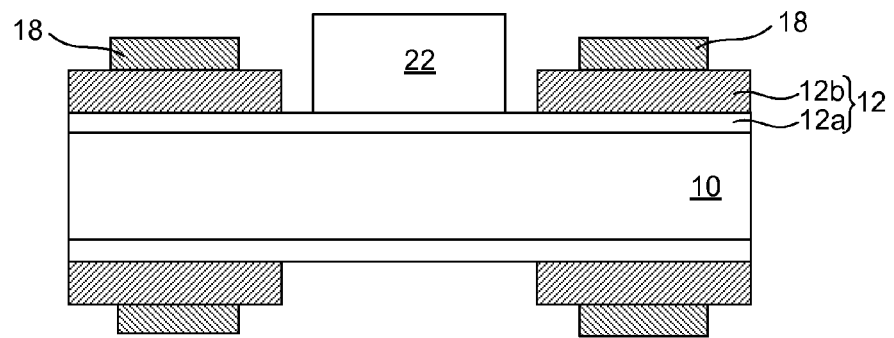

A die 22 may then be positioned in the opening 21 and positioned on the resin layer 12a, as illustrated in FIG. 1(E). The die 22 may be any suitable die and may include various layers positioned therein and thereon including, but not limited to, dielectric layer, metallization layers, protective layers, and adhesion layers.

Figure 1F:
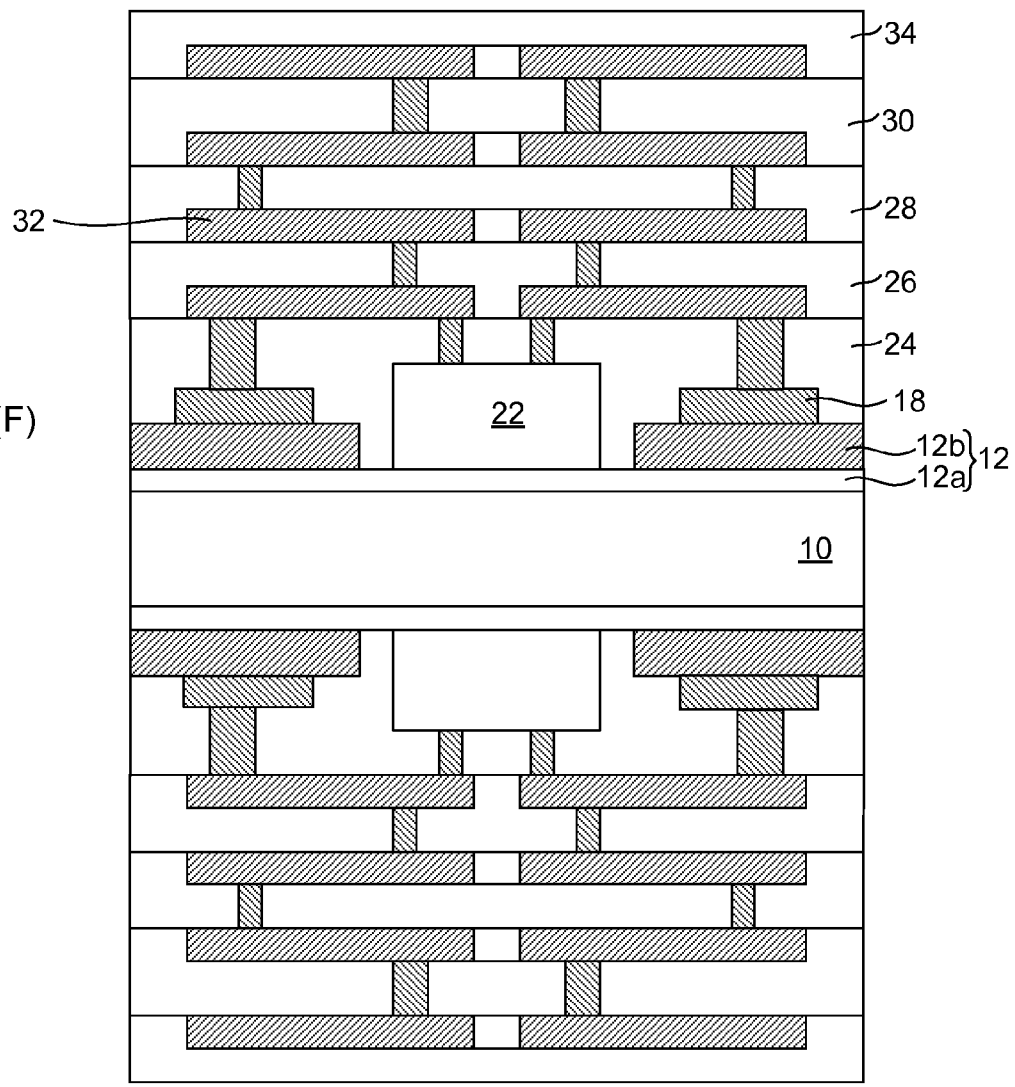

Layers of dielectric material 24, 26, 28, 30 and electrically conductive pathways 32 may then be formed on the structure, as illustrated in FIG. 1(F). Any number of such layers may be present, and additional components may also be present, including, but not limited to, additional dies either embedded in the structure or positioned on a surface thereof. The layers may be formed using any suitable process, including, but not limited to, a BBUL process. The upper layer 34 illustrated in FIG. 1(F) may be a material such as a solder resist material that can patterned to have openings therein for subsequent attachment to another structure such as a die or package.

Figure 1G:
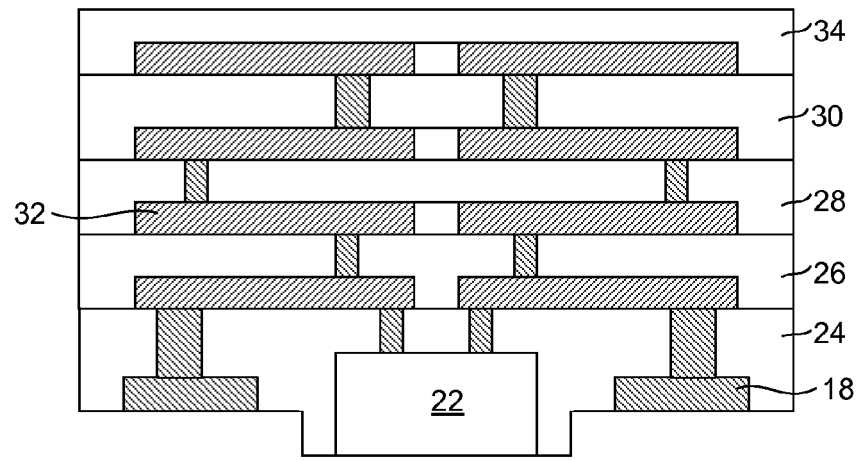

The illustrated assembly in FIG. 1(F) may be part of a larger panel of assemblies with a plurality of identical back-to-back structures. In certain embodiments thousands of assemblies may be formed from a single panel. Individual substrate assemblies may be detached from either side of the carrier region. FIG. 1(G) illustrates one such substrate assembly. The carrier region 10 and the resin coated Cu layer 12 have been removed. The removal of the various layers may be accomplished using a number of techniques, depending at least in part on the structure of the carrier region 10.

Figure 2:
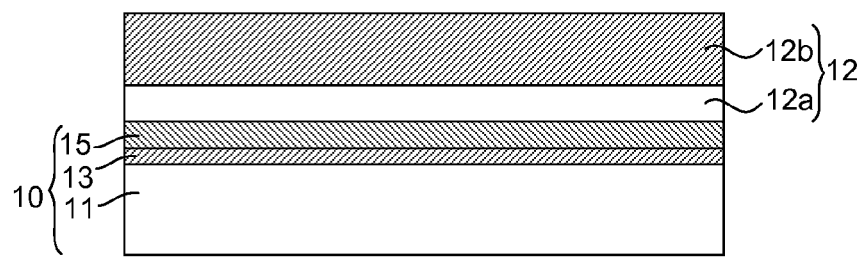
FIG. 2 illustrates a portion of an assembly including stacked metal layers, in accordance with certain embodiments.

FIG. 2 illustrates a portion of an assembly similar to that illustrated in FIG. 1(A), including a carrier region 10 including a resin coated Cu layer 12 thereon. The carrier region 10 may have a variety of structures, and may be removed using several different techniques. In the embodiment illustrated in FIG. 2, the carrier region 10 includes a core layer 11, metal layer 13, and metal layer 15 stacked on the core layer 11. The core layer 11 may be formed from any suitable core material, for example, a prepreg material. The metal layer 13 and the metal layer 15 may be formed from a metal such as a Cu foil.

When a Cu foil is used, the surface of upper metal layer 15 should be roughed to ensure a good bond with the resin-coated Cu foil. Such roughed foil may be pretreated to be roughened or may be roughened by subjecting it to a suitable chemical treatment. As illustrated in FIG. 2, the upper metal layer 15 is positioned directly on the lower metal layer 13. In the configuration illustrated in FIG. 2, there is no adhesive holding the upper metal layer 15 to the lower metal layer 13.

As noted above, assemblies may be formed as part of a large panel of back-to-back individual substrate assemblies. In certain configurations, the panel may be formed so that the lower metal layer 13 of FIG. 2 does not extend all the way to the panel edge, while the upper metal layer 15 extends beyond the lower metal layer 13. At those end portions where the lower metal layer 13 is not present, the upper metal layer 15 is bonded to the core 11 (for example, from epoxy in the prepreg material of the core). This bond between the upper metal layer 15 and the core 11 acts to hold the assembly together. When panel processing is compete, the end regions where the upper metal layer 15 is bonded to the core 11 are cut off. Along the rest of the length of the panel there is no bonding material holding the upper metal layer 15 and the lower metal layer 13 together. As a result, the assembly should come apart between the upper metal layer 15 and the lower metal layer 13. Sometimes a mechanical peel back operation is used to ensure proper separation between the layers.

Once the core 11 and lower metal layer 13 are separated, the other layers, including the upper metal layer 15, and the resin coated Cu layer 12, may be removed using any suitable process, including, but not limited to etching of metal regions and mechanical removal of non-metal regions.

In another aspect of certain embodiments, it is possible to remove the carrier region 10, the lower metal layer 13, and the upper metal layer 15 by separating the resin coated Cu layer 12. Depending on the composition of the resin layer 12*a*, it may be possible to thermally release the resin layer 12*a* from the metal layer 15 or from the Cu layer 12*b*.

Figure 3:
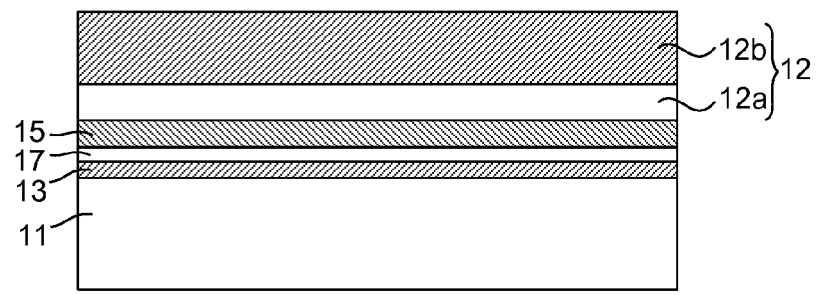
FIG. 3 illustrates a portion of an assembly including stacked metal layers, in accordance with certain embodiments.

Certain embodiment utilize metal layers 13 and 15 that are attached together using an adhesive material. FIG. 3 illustrates an embodiment including an adhesive layer 17 positioned between the lower metal layer 13 and the upper metal layer 15. The adhesive 17 may in certain embodiments include one or more materials selected from the group of an organic adhesive, a metal oxide adhesive, and a thermal release adhesive. A mechanical peel process may be used to separate the lower metal layer 13 from the upper metal layer 15 when an non-thermally releasable organic adhesives or metal oxide adhesives are used. A thermal release adhesive may be heated to effect separation from the adjacent layer(s).

Figure 4:
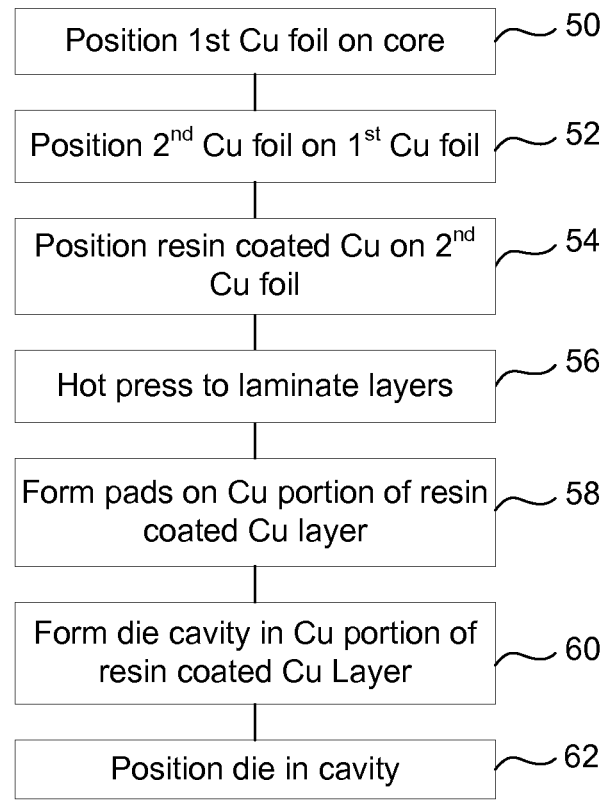
FIG. 4 illustrates a flow chart of process operations for forming an assembly, in accordance with certain embodiments.

FIG. 4 is a flowchart of operations, in accordance with certain embodiments. Box 50 is positioning a Cu foil on a core formed from, for example, a prepreg material. Box 52 is positioning a second Cu foil on the first Cu foil. The second Cu foil should be configured so that it includes an upper surface that is somewhat roughened, to ensure that a satisfactory bond will be made during a later hot pressing operation. A pretreated Cu foil may be obtained or can be formed using a suitable chemical process to treat the surface. Box 54 is positioning a resin-coated Cu layer on the second Cu foil layer. The resin coated Cu layer includes a first layer comprising a resin and a second layer comprising Cu. The resin may be an epoxy resin and may include a filler therein. Box 56 is laminating the layers using a hot press operation where the stack of layers is subjected to elevated heat and pressure. Box 58 is forming pads such as PoP bonding pads on the surface of the Cu layer of the resin coated Cu layer. Box 60 is forming a cavity in the Cu layer of the resin coated Cu layer into which a die will be placed. The cavity may be located between the PoP pads. Box 62 is positioning the die in the cavity. Additional operations, including, but not limited to, building up layers of dielectric and electrically conductive pathways, may then be carried out, using, for example, suitable BBUL operations. It should be appreciated that various additions, subtraction, and/or modifications may be made to the above operations, within the scope of various embodiments.

Figure 5:
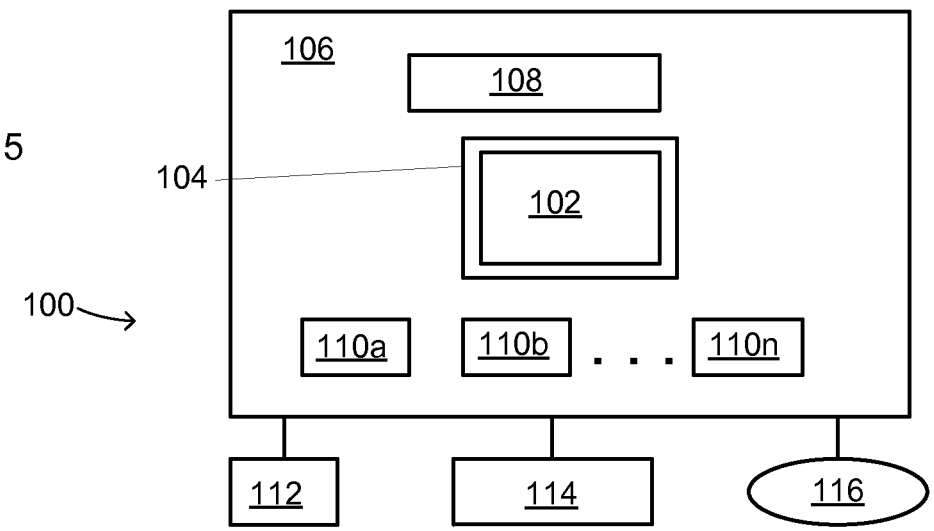
FIG. 5 illustrates an electronic system arrangement in which embodiments may find application.

Assemblies including components formed as described in embodiments above may find application in a variety of electronic components. FIG. 5 schematically illustrates one example of an electronic system environment in which aspects of described embodiments may be embodied. Other embodiments need not include all of the features specified in FIG. 5, and may include alternative features not specified in FIG. 5.

The system 100 of FIG. 5 may include at least one die 102 positioned in a package substrate 104, which is then coupled to a PCB 106. The package substrate 104 is an example of an electronic device assembly that may be formed in accordance with embodiments such as described above. A variety of other system components, including, but not limited to memory and other components discussed below, may also include structures formed in accordance with the embodiments described above.

The system 100 may further include memory 108 and one or more controllers 110*a*, 110*b* . . . 110*n*, which may also be disposed on the PCB 106. The system may include a variety of other components, including, but not limited to, storage 112, display 114, and network connection 116. The system 101 may comprise any suitable computing device, including, but not limited to, a mainframe, server, personal computer, workstation, laptop, tablet, netbook, handheld computer, handheld gaming device, handheld entertainment device (for example, MP3 (moving picture experts group layer—3 audio) player), PDA (personal digital assistant) smart phone or other telephony device (wireless or wired), network appliance, virtualization device, storage controller, network controller, router, etc.

It should be appreciated that many changes may be made within the scope of the embodiments described herein. The term die as used herein refers to a workpiece that is transformed by various process operations into a desired electronic device. A die is usually singulated from a wafer, and may be made of semiconducting, non-semiconducting, or combinations of semiconducting and non-semiconducting materials. Terms such as "first", "second", and the like, if used herein, do not necessarily denote any particular order, quantity, or importance, but are used to distinguish one element from another. Terms such as "top", bottom", "upper", "lower", "over", "under", and the like are used for descriptive purposes and to provide a relative position and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An assembly comprising:
a carrier structure;
a resin coated copper layer positioned on the carrier structure, the resin coated copper layer including a first layer comprising a resin and a second layer comprising copper, the first layer bonded to the second layer, the first layer positioned between the carrier structure and the second layer;
an opening extending through the second layer of the resin coated copper layer;
a die positioned in the opening, the die positioned on the first layer comprising a resin, the die including a first surface and a second surface opposite the first surface, the first surface positioned between the carrier structure and the second surface, the first surface defining a total first surface area, wherein the first layer comprising a resin is positioned between the first surface and the carrier structure across the total first surface area and
a plurality of dielectric layers and metal interconnections positioned on the second layer and on the die.

2. The assembly of claim 1, wherein the carrier structure comprises:
a core;
a first metal layer on the core; and
a second metal layer on the first metal layer.

3. The assembly of claim 2, wherein the first metal layer and the second metal layer each comprise copper.

4. The assembly of claim 2, further comprising an adhesive layer positioned between the first metal layer and the second metal layer.

5. The assembly of claim 4, the adhesive layer selected from the group consisting of an organic adhesive, a metal oxide adhesive, and a thermally releasing adhesive.

6. The assembly of claim 2, wherein the core comprises a prepreg material.

7. The assembly of claim 2, wherein the first metal layer is in direct contact with the second metal layer.

8. The assembly of claim 1, wherein the resin comprises an epoxy.

9. The assembly of claim 1, wherein the resin comprises an epoxy mixed with a non-epoxy filler material.

10. The assembly of claim 1, wherein the opening does not extend through the first layer comprising a resin.

11. The assembly of claim 1, wherein the die comprises a semiconductor material.

12. A method comprising:
providing a carrier structure;
positioning a resin coated copper layer on the carrier structure, the resin coated copper layer including a first layer comprising a resin and a second layer comprising copper, the first layer bonded to the second layer;
forming a plurality of contact pads on the second layer comprising copper;
forming a cavity extending through the second layer comprising copper, the cavity sized to accept a die;
positioning a die in the cavity on the first layer comprising a resin, wherein the first layer comprising a resin extends between the die and the carrier structure;
embedding the die in a dielectric material;
forming a plurality of dielectric layers and electrically conductive pathways on the dielectric material; and
separating the carrier structure and the first layer comprising a resin from the die.

13. The method of claim 12, wherein the carrier structure includes a core, a first metal layer, and a second metal layer, wherein the first metal layer is positioned between the core and the second metal layer, and wherein the resin coated copper layer is positioned on the second metal layer with the first layer comprising a resin positioned between the second metal layer and the second layer comprising copper.

14. The method of claim 13, wherein the core includes a prepreg material layer, and wherein the first metal layer is positioned between the prepreg material layer and the second metal layer.

15. The method of claim 13, wherein the first metal layer and the second metal layer each comprise copper.

16. The method of claim 12, wherein the positioning the die in the cavity comprises positioning a die comprising a semiconducting material in the cavity.

17. A method comprising:
providing a carrier structure;
positioning a resin coated copper layer on the carrier structure, the resin coated copper layer including a first layer comprising a resin and a second layer comprising copper, the first layer bonded to the second layer;
forming a plurality of contact pads on the second layer comprising copper;
forming a cavity in the second layer comprising copper, the cavity sized to accept a die, wherein the forming a cavity comprises etching through the second layer comprising copper of the resin coated copper layer, using the first layer comprising a resin as an etch stop layer;
positioning a die in the cavity, the positioning the die in the cavity comprising positioning the die on the first layer comprising a resin, wherein the first layer comprising a resin extends between the die and the carrier structure;
embedding the die in a dielectric layer;
forming a plurality of additional dielectric layers and electrically conductive pathways on the dielectric layer; and
separating the carrier structure and the first layer comprising a resin from the die.

18. The method of claim 17, the providing a carrier structure comprises providing a first metal layer on a core material and providing a second metal layer on the first metal layer, wherein the first metal layer is positioned between the core material and the second metal layer.

19. The method of claim 18, wherein the providing a carrier structure further comprises providing an adhesive layer between the first metal layer and the second metal layer.

20. The method of claim 18, further comprising, after the positioning the resin coated copper layer on the carrier structure, and prior to the forming a plurality of contact pads on the second layer comprising copper, performing a hot press operation to laminate a plurality of the layers.

* * * * *